(12) United States Patent
Bartley et al.

(10) Patent No.: US 7,402,912 B2
(45) Date of Patent: Jul. 22, 2008

(54) METHOD AND POWER CONTROL STRUCTURE FOR MANAGING PLURALITY OF VOLTAGE ISLANDS

(75) Inventors: Gerald Keith Bartley, Rochester, MN (US); Darryl John Becker, Rochester, MN (US); Paul Eric Dahlen, Rochester, MN (US); Philip Raymond Germann, Oronoco, MN (US); Andrew Benson Maki, Rochester, MN (US); Mark Owen Maxson, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 234 days.

(21) Appl. No.: 11/304,138

(22) Filed: Dec. 15, 2005

(65) Prior Publication Data

US 2007/0138653 A1    Jun. 21, 2007

(51) Int. Cl.
*H01L 23/48* (2006.01)
*H01L 23/52* (2006.01)
*H01L 29/40* (2006.01)

(52) U.S. Cl. ................. 257/777; 257/778; 257/E23.085
(58) Field of Classification Search ................. 257/777, 257/778, 686, E23.085, 786
See application file for complete search history.

(56) References Cited

U.S. PATENT DOCUMENTS 6,828,666 B1 * 12/2004 Herrell et al. ............... 257/691
2006/0038272 A1 * 2/2006 Edwards ..................... 257/686

\* cited by examiner

*Primary Examiner*—Phat X Cao
(74) *Attorney, Agent, or Firm*—Joan Pennington

(57) ABSTRACT

A power control method and power control structures are provided for managing a plurality of voltage islands of a functional chip. The power control structure includes a supply control and partition chip positioned between a substrate carrier and a functional chip including a plurality of voltage islands. The supply control and partition chip includes a plurality of first electrical connections to the functional chip including the plurality of voltage islands. The supply control and partition chip includes a plurality of second electrical connections to the substrate carrier. Power applied to predefined ones of the first electrical connections to the functional chip are selectively switched on and off by the supply control and partition chip.

3 Claims, 2 Drawing Sheets

METHOD AND POWER CONTROL STRUCTURE FOR MANAGING PLURALITY OF VOLTAGE ISLANDS

FIELD OF THE INVENTION

The present invention relates generally to the data processing field, and more particularly, relates to a method and power control structures for managing a plurality of voltage islands of a functional chip.

DESCRIPTION OF THE RELATED ART

Power dissipation today and as projected into the future is clearly one of the key limitations for electronic components and systems. Power dissipation issues with current and future silicon technologies include a significant leakage current component resulting from thinner oxides associated with smaller feature sizes of the ever-shrinking transistor sizes.

Approaches to control power dissipation have generally included the stopping of clocks to a segment of the chip. As leakage current becomes such a large component of the total power dissipation, stopping the clocks is no longer an adequate solution to the problem.

A need exists for an effective mechanism for minimizing leakage current and overall power dissipation.

As used in the following description and claims the terms ball grid array (BGA) device and BGA connections are not limited to BGA solder connections and should be understood to include multiple various other chip carrier technologies including, for example, Land Grid Array (LGA), pin grid array, copper-copper thermal compression connections and similar devices.

As used in the present specification and claims, the term substrate carrier should be understood to include a chip carrier, a module carrier, and a printed circuit board or PCB.

As used in the present specification and claims, the term printed circuit board or PCB means a substrate or multiple layers (multi-layer) of substrates used to electrically attach electrical components and should be understood to generally include circuit cards, printed circuit cards, printed wiring cards, and printed wiring boards.

SUMMARY OF THE INVENTION

Principal aspects of the present invention are to provide a power control method and power control structures for managing a plurality of voltage islands of a functional chip. Other important aspects of the present invention are to provide such power control method and power control structures substantially without negative effect and that overcome many of the disadvantages of prior art arrangements.

In brief, a power control method and power control structures are provided for managing a plurality of voltage islands of a functional chip. The power control structure includes a supply control and partition chip positioned between a substrate carrier and the functional chip including the plurality of voltage islands. The supply control and partition chip is supported by the substrate carrier and carries the functional chip. The supply control and partition chip includes a plurality of first electrical connections to the functional chip including the plurality of voltage islands. The supply control and partition chip includes a plurality of second electrical connections to the substrate carrier. Power applied by predefined ones of the first electrical connections to the functional chip are selectively switched on and off by the supply control and partition chip.

In accordance with features of the invention, the supply control and partition chip selectively adjusts a local voltage coupled by a set of predetermined ones of the first electrical connections to the functional chip. More of the first electrical connections or interconnects at a tighter pitch are provided between the supply control and partition chip and the functional chip than the second electrical connections between the supply control and partition chip and the substrate carrier.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the preferred embodiments, a power control method and structures are provided for managing power to a plurality of voltage islands on a chip. The power control method and structures of the invention enables removing voltage from unused functions and macros on the chip and thus eliminate the leakage current component. The power control structures of the invention avoid the conventional challenge of increased complexity for routing and controlling the voltage islands on a PCB and through a chip carrier.

In accordance with features of the preferred embodiments, a power control method and structures are provided for optimizing chip performance where certain functions may be the cycle limiting path. Power control structures of the invention are provided for selectively raising or lowering the voltage to selected functions, such as the floating point unit, or the processor, or arrays only when needed for maximizing performance of particular functions. Power control structures of the invention are provided for selectively lowering the voltage on selected segments of the chip in order to keep the total power dissipation of the given chip to an acceptable level and to better optimize performance of a system.

In accordance with features of the preferred embodiments, a semiconductor device or sub-carrier chip with embedded power control circuits is placed between a conventional carrier and a functional chip or chips including a plurality of voltage islands. The voltage islands are selectively controlled either in an on-off fashion to reduce power dissipation or in an analog fashion to better optimize the use of the limited power dissipation and or cooling capabilities.

Figure 1:
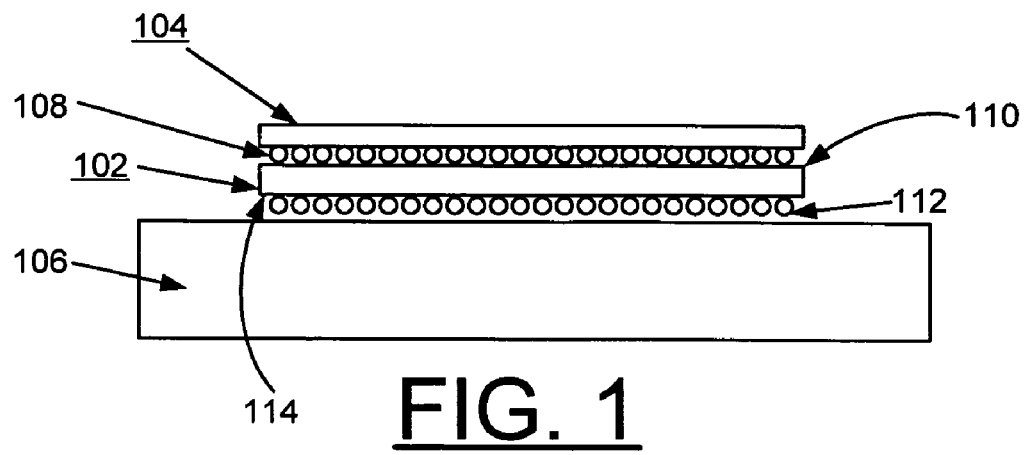
FIG. 1 is a side view not to scale illustrating an exemplary power control structure for managing a plurality of voltage islands in accordance with the preferred embodiment.

Having reference now to the drawings, in FIG. 1, there is shown an exemplary power control structure for managing a plurality of voltage islands generally designated by the reference character 100 in accordance with the preferred embodiment. Power control structure 100 includes a supply control and partition chip generally designated by the reference character 102 in accordance with the preferred embodiment.

Supply control and partition chip 102 of the present invention containing power capable switch and control devices for managing a plurality of voltage islands of a chip advantageously is used for coupling between a chip to chip carrier, a chip to PCB, and a multi-chip module to PCB.

As shown in FIG. 1, power control structure 100 includes the supply control and partition chip 102 positioned between a functional chip 104 and a substrate carrier 106. Supply control and partition chip 102 is electrically connected to the functional chip 104, by a plurality of electrical connections generally designated by the reference character 108 on an upper surface 110 of the supply control and partition chip. Supply control and partition chip 102 is electrically connected to the substrate carrier 106 by a plurality of electrical connections generally designated by the reference character 112 on a lower surface 114 of the supply control and partition chip. The plurality of electrical connections 108 and 112 include, for example, solder bumps, such as solder bumps formed by controlled collapse chip connection (C4), and arranged, for example, as a ball grid array (BGA).

Supply control and partition chip 102 contains switching elements, such as silicon controlled rectifiers (SCRs), or Darlington transistor pairs, or small regulator devices, Micro-Electronic-Mechanical Systems (MEMS) devices, or other switch capable device architectures. Supply control and partition chip 102 advantageously contains also some amount of embedded capacitance to support the local supply transients caused by ramping up or down the voltage either in small increments or in a controlled turn-on/turn-off fashion. Supply control and partition chip 102 typically contains also some amount of control logic which is managed by a controller with knowledge of what functions or portions of functions may be required versus what can be turned off, or have a supply voltage selectively adjusted or modified up or down. Supply control and partition chip 102 is managed by either hardware or software which determines when, for example, a floating point engine would be used or could be shut down due to projected inactivity.

Figure 2:
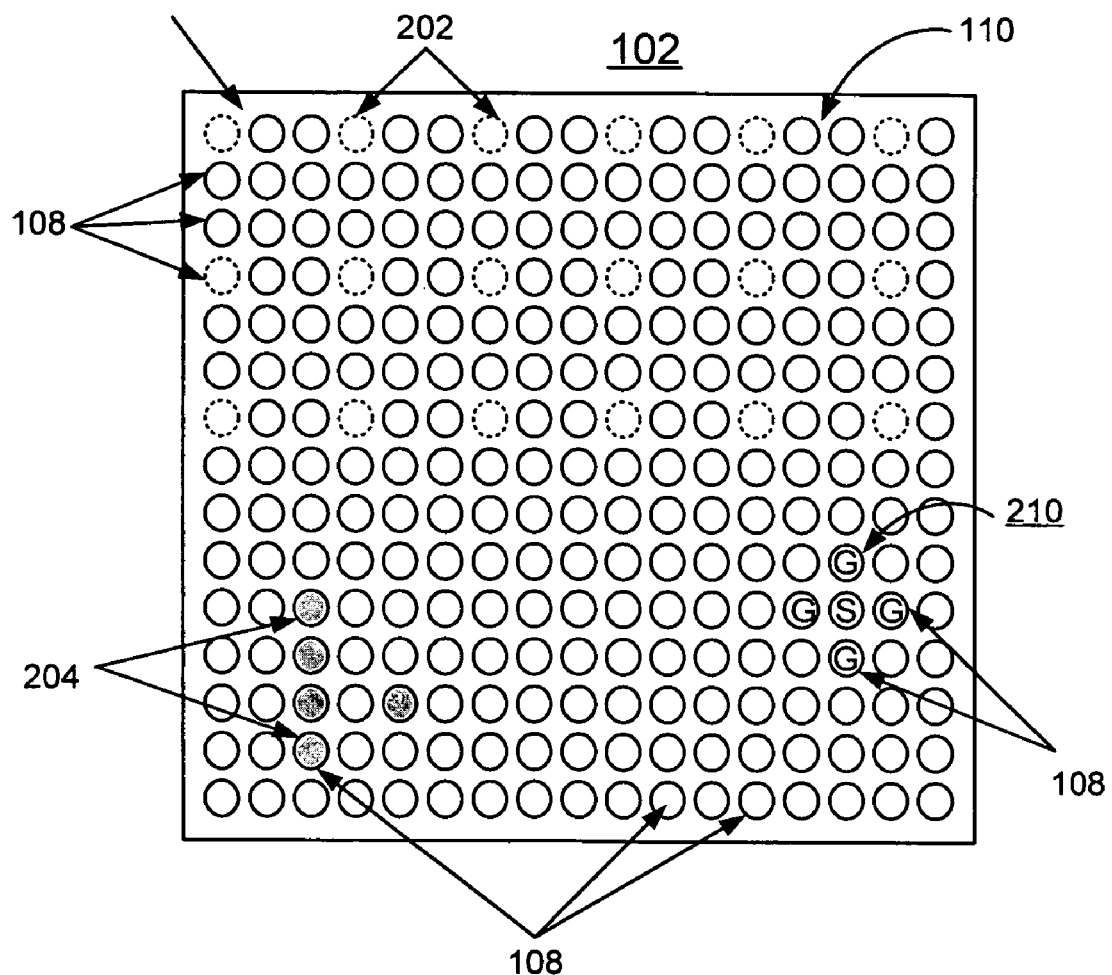
FIG. 2 is a top view illustrating exemplary control functions of a supply control and partition chip in accordance with the preferred embodiment.

Referring to FIG. 2, supply control and partition chip 102 includes a predefined pattern generally designated by the reference character 200 of electrical connections 108. Each power electrical connection or solder bump 108 can be switched on and off by switch and control circuitry within chip 102, or can be coupled to a linear control set of circuitry within chip 102 to adjust a local voltage coupled by a particular electrical connection or solder bump 108 to a particular functional island on the functional chip 104.

A plurality of selected ones 202 of the electrical connections 108 indicated by dotted lines represent, for example, selected connections that are selectively turned on and turned off. A plurality of selected ones 204 of the electrical connections 108 indicated by shading represent, for example, a linear control set of for modifying a local supply voltage applied to a particular functional island on the functional chip 104.

In accordance with features of the preferred embodiments, the supply control and partition chip 102 can be used to switch the solder bumps or connections 108 between one voltage and another voltage. This could be a very important technique to allow for the migration of functions between different technologies. This approach could be used in its simplest form to connect an appropriate I/O supply, for example, from substrate carrier 106 to a driver/receiver cell of functional chip 104 to simplify the design of circuitry, which must be able to interoperate between the different supply voltages of different silicon technologies.

In the illustrated embodiment of power control structure 100, the supply control and partition chip 102 can include a regular grid arrangement for signal and power pass through electrical connections 108 and 112. For each power structure connections 108, the supply control and partition chip 102 includes a register accessible/controllable switch device to open and close the interconnect 108 of power between the power structure of the functional chip 104 containing a given number of voltage islands and the substrate carrier 106. A particular supply control and partition chip 102 can be used for different types of functional chips 104, that is for more than one functional chip part number. The additional features over traditional packages include control signals which identify and switch certain solder bumps 108 on and off between the functional chip 104 and the substrate carrier 106. These control signals could originate either in the functional chip 104 or in the system path between another card or board (not shown) and the substrate carrier 106.

In accordance with features of the preferred embodiments, signals from substrate carrier 106 typically are routed directly through the supply control and partition chip 102 to the functional chip 104, for example, essentially going in a straight-through path. Given the ability to make smaller micro-bumps on the silicon, it is also possible to build a coaxial like structure around a signal path to help compensate for the slightly longer path for the signals through the supply control and partition chip 102 of the invention.

For example, as illustrated in FIG. 2, a coaxial like structure generally designated by reference character 210 is provided around a signal path or connection 108 labeled S and include a grid of electrical connections 108 labeled G surrounding the particular signal connection S. Capacitance and additional power and ground wiring included in the supply control and partition chip 102 is provided to compensate for and depending on the design could improve the power structure by having more decoupling. This added decoupling is used to offset any increase in inductance to on-module or on-card decoupling.

In accordance with features of other preferred embodiments, utilizing the ability to have more interconnects at a tighter pitch in the connection between a supply control and partition chip and a functional chip, enables finer control and partition on the functional chip than would otherwise be possible with conventional packaging approaches. For example, such an interconnection arrangement is illustrated and described with respect to power control structures of FIGS. 3 and 4.

Figure 3:
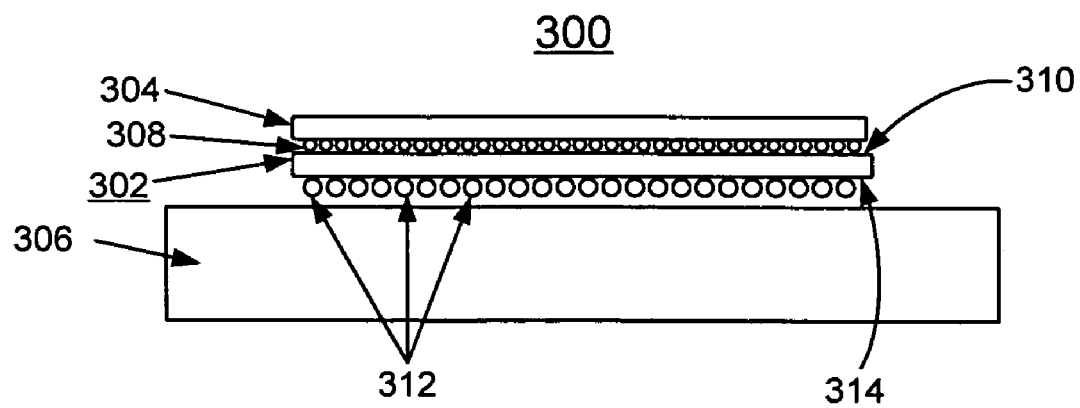
FIG. 3 is a side view not to scale illustrating an exemplary power control structure for managing a plurality of voltage islands in accordance with another preferred embodiment.

Referring now to FIG. 3, there is shown another exemplary power control structure for managing a plurality of voltage islands generally designated by the reference character 300 in accordance with the preferred embodiment. Power control structure 300 includes a supply control and partition chip generally designated by the reference character 302 in accordance with the preferred embodiment.

As shown in FIG. 3, power control structure 300 includes the supply control and partition chip 302 positioned between a functional chip 304 and a substrate carrier 306. Supply control and partition chip 302 is electrically connected to the functional chip 304, by a plurality of electrical connections generally designated by the reference character 308 on an upper surface 310 of the supply control and partition chip. Supply control and partition chip 302 is electrically connected to the substrate carrier 306 by a plurality of electrical connections generally designated by the reference character 312 on a lower surface 314 of the supply control and partition chip. The plurality of electrical connections 308 and 312 include, for example, solder bumps, such as solder bumps formed by controlled collapse chip connection (C4), and arranged, for example, as a ball grid array (BGA).

In the power control structure 300, the plurality of electrical connections 308 to the functional chip 304 has a substantially smaller or tighter pitch than the plurality of electrical connections 312 to the substrate carrier 306.

Figure 4:
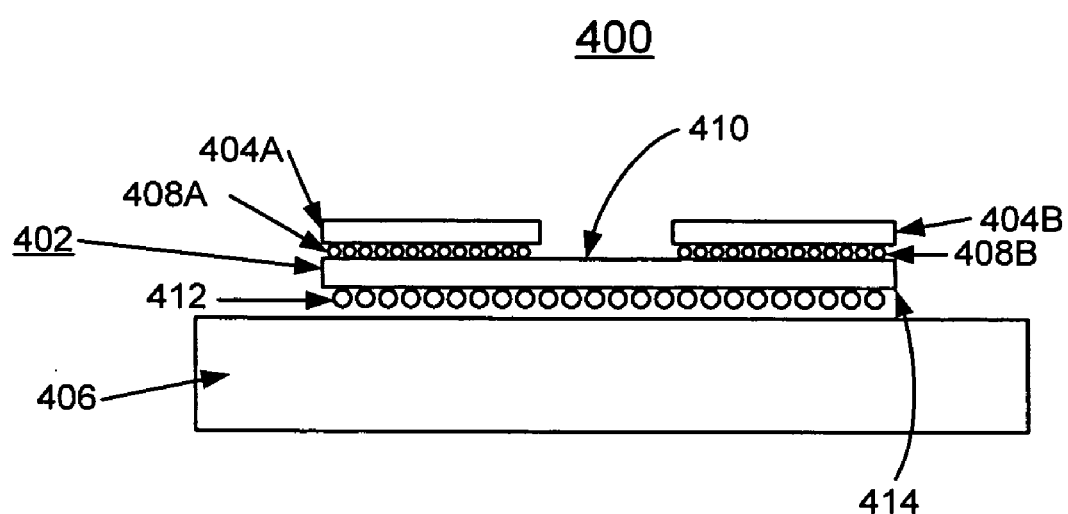
FIG. 4 is a side view not to scale illustrating an exemplary power control structure for managing a plurality of voltage islands in accordance with yet another preferred embodiment.

Referring now to FIG. 4, there is shown another exemplary power control structure for managing a plurality of voltage islands generally designated by the reference character 400 in accordance with the preferred embodiment. Power control structure 400 includes a supply control and partition chip generally designated by the reference character 402 in accordance with the preferred embodiment. Power control structure 400 includes a Multi-chip Module arrangement with the single supply control and partition chip 402.

As shown in FIG. 4, power control structure 400 includes the supply control and partition chip 402 positioned between a pair of functional chips 404A, 404B and a substrate carrier 406. Supply control and partition chip 402 is electrically connected to the functional chip chips 404A, 404B, by a respective plurality of electrical connections generally designated by the reference characters 408A, 408B on an upper surface 410 of the supply control and partition chip. Supply control and partition chip 402 is electrically connected to the substrate carrier 406 by a plurality of electrical connections generally designated by the reference character 412 on a lower surface 414 of the supply control and partition chip. The plurality of electrical connections 408A, 408B and 412 include, for example, solder bumps, such as solder bumps formed by controlled collapse chip connection (C4), and arranged, for example, as a ball grid array (BGA).

In the power control structure 400, the plurality of respective electrical connections 408A, 408B to the functional chips 404A, 404B has a substantially smaller or tighter pitch than the plurality of electrical connections 412 to the substrate carrier 406.

It should be understood that the present invention is not limited to the use of through hole silicon structures; for example, wire-bond, ball-bond, tab or other attach mechanisms can be used for electrical connections between respective functional chip 104, 304, functional chips 404A, 404B and the respective supply control and partition chip 102, 302, 402. It should be understood that the present invention is not limited to just two layers, such as defined by the respective functional chip 104, 304, functional chips 404A, 404B and the supply control and partition chip 102, 302, 402, and can be extended to more than two layers, for example, including more than one power-control silicon chip 102, 302, 402.

While the present invention has been described with reference to the details of the embodiments of the invention shown in the drawing, these details are not intended to limit the scope of the invention as claimed in the appended claims.

What is claimed is:

1. A power control method for managing a plurality of voltage islands of a functional chip with a power control structure including a supply control and partition chip positioned between a substrate carrier and the functional chip, said method comprising the steps of:

providing a plurality of first electrical connections connecting the supply control and partition chip with the functional chip including the plurality of voltage islands providing a plurality of second electrical connections connecting the supply control and partition chip to the substrate carrier;

selectively switching on and off power applied to predefined ones of the first electrical connections to the functional chip with the supply control and partition chip.

2. The power control method as recited in claim 1 further includes selectively adjusting a local voltage coupled by a set of predetermined ones of said first electrical connections to said functional chip with the supply control and partition chip.

3. The power control method as recited in claim 1 includes coupling signals between the substrate carrier and the functional chip using predefined ones of said first electrical connections being connected to respective ones of said second electrical connections with the supply control and partition chip.

* * * * *